United States Patent

[11] 3,624,465

[72] Inventor Robert M. Moore
Skillman, N.J.
[21] Appl. No. 740,161
[22] Filed June 26, 1968
[45] Patented Nov. 30, 1971
[73] Assignee RCA Corporation

[54] HETEROJUNCTION SEMICONDUCTOR TRANSDUCER HAVING A REGION WHICH IS PIEZOELECTRIC
14 Claims, 5 Drawing Figs.

[52] U.S. Cl. ........................................................ 317/235 R, 317/235 M, 317/235 AC, 317/241, 179/110, 332/7.51
[51] Int. Cl. ........................................................ H01l 11/00, H01l 15/00
[50] Field of Search ........................................... 317/234, 235, 26, 42, 48.4, 237, 241; 313/108; 343/8; 332/7.51; 307/312; 330/31; 179/110

[56] References Cited

UNITED STATES PATENTS

| | | | |
|---|---|---|---|
| 3,377,588 | 4/1968 | Picquendar et al. .......... | 317/235 |
| 3,387,230 | 6/1968 | Marinace ...................... | 317/235 |
| 3,390,311 | 6/1968 | Aven et al. ..................... | 317/235 |
| 3,398,311 | 8/1968 | Page ............................ | 317/235 X |
| 3,417,301 | 12/1968 | Galli et al. .................... | 317/235 X |
| 3,443,167 | 5/1969 | Willardson et al. ........... | 317/235 X |
| 3,460,005 | 8/1969 | Kanda et al. .................. | 317/235 |
| 3,479,572 | 11/1969 | Pokorny ....................... | 317/234 |
| 3,483,397 | 12/1969 | Miller et al. .................. | 317/235 X |
| 3,240,962 | 3/1966 | White ........................... | 317/235 X |
| 3,427,410 | 2/1969 | Diamond ...................... | 317/235 X |
| 3,473,095 | 10/1969 | Griffiths et al. ............... | 317/241 |

*Primary Examiner*—John W. Huckert
*Assistant Examiner*—Andrew J. James
*Attorney*—Glenn H. Bruestle

ABSTRACT: A stress sensitive semiconductor device having two adjacent semiconductor regions at least one of which is piezoelectric, with a PN-heterojunction between the regions. Upon application of stress to the heterojunction, the polarization of the piezoelectric semiconductor is altered to modulate current flow across the PN junction.

INVENTOR
ROBERT M. MOORE

BY

ATTORNEY

HETEROJUNCTION SEMICONDUCTOR TRANSDUCER HAVING A REGION WHICH IS PIEZOELECTRIC

BACKGROUND OF THE INVENTION

This invention relates to the field of semiconductor transducers, and more particularly to semiconductor transducers of a type whose operation is affected by boundary conditions at the interface between dissimilar semiconductor materials.

Stress-sensitive semiconductor devices are well known in the art. Such devices usually take the form of a body of monolithic semiconductor material having a PN-junction therein, the junction being disposed near an external surface of the device so that pressure applied to the external surface is transmitted to the junction. The stress thus created in the PN-junction region alters the voltage-current characteristics of the device, so that upon application of a potential difference between the device electrodes, the current flowing between the electrodes is modulated in accordance with the applied pressure.

Such prior art devices, however, are difficult to fabricate, since the stress applying stylus must be very precisely positioned over the PN-junction In addition, such devices are mechanically fragile, since the PN-junction is sensitive to stress only at pressure levels near the fracture point of the semiconductor material. These devices generally exhibit temperature sensitivity, critical mechanical biasing requirements, and poor dynamic range.

While the precise basis for the stress sensitivity of such prior art transducers is not completely understood, it is believed that the primary effect of the applied stress is to change the energy gap of the semiconductor material.

SUMMARY OF THE INVENTION

My invention is directed to a transducer which comprises two contiguous semiconductor regions having different field-independent polarizations. The field-independent polarization of at least one semiconductor region is variable in response to an external stimulus.

Means is provided for coupling the external stimulus to the aforementioned stimulus variable region. Also provided is means for producing a signal responsive to the variation in field-independent polarization of the aforementioned stimulus variable.

One particular embodiment of the invention takes the form of a stress-sensitive semiconductor device employing a PN-heterojunction between crystalline selenium and crystalline cadmium selenide layers. The semiconductor layers are disposed on a flexible substrate. Flexing of the substrate by an externally applied force results in modulation of current flow across the PN-heterojunction in accordance with the applied force.

IN THE DRAWING

DETAILED DESCRIPTION

Figures 1, 2, 3, 5:
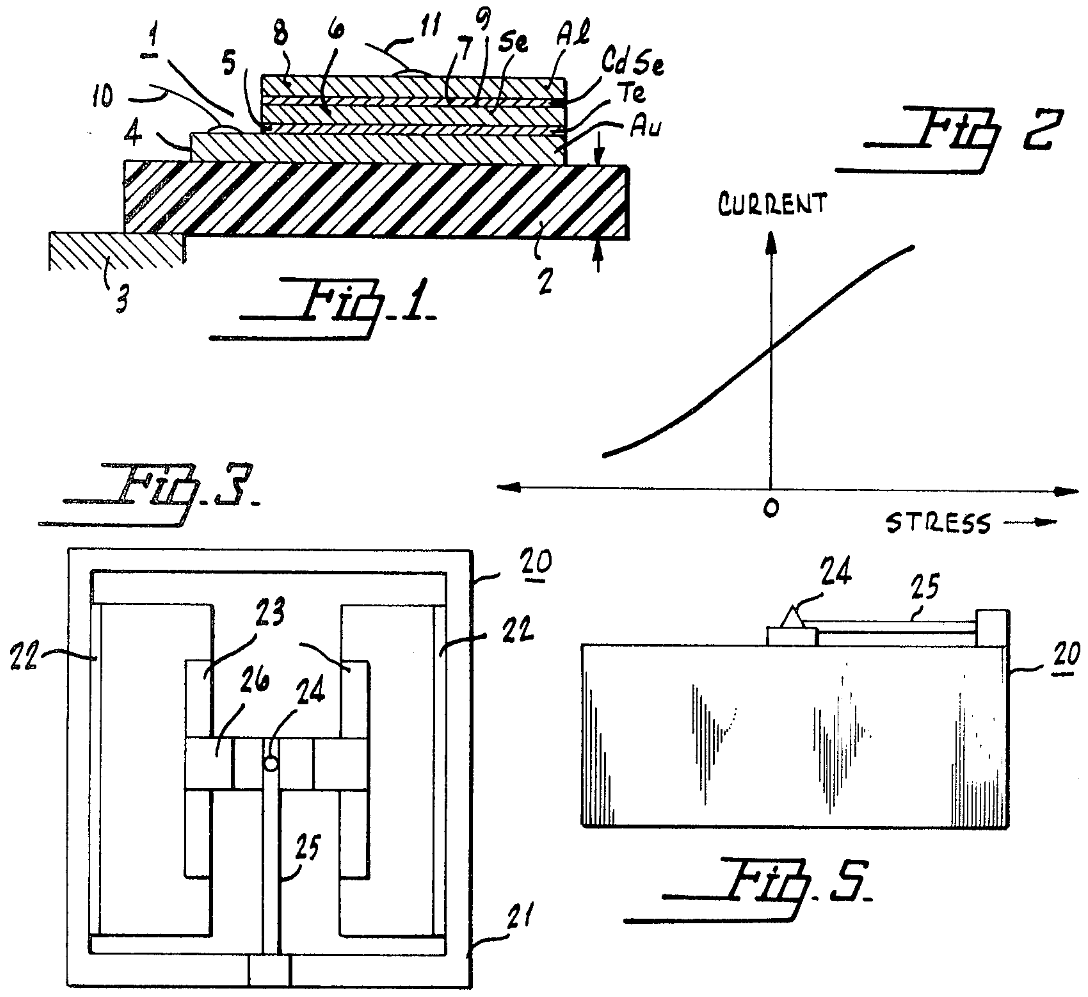
FIG. 1 shows a cross-sectional view of a stress-sensitive semiconductor device according to a preferred embodiment of the invention.
FIG. 2 shows the general shape of the stress-current characteristic of the device shown in FIG. 1.
FIGS. 3, 4 and 5 show bottom, elevational and side views of a stereophonic pickup employing the stress-sensitive device of FIG. 1.

When two semiconductor layers are in contact at an interface therebetween, and an electric field is applied to the layers (usually by means of electrodes contacting the semiconductor layers), electrostatic theory requires that the component of the dielectric displacement D normal to the interface be continuous across the interface.

Unstimulable dielectric (including semiconductor) materials are, for the purposes of this specification, defined as those which exhibit a polarization dependent only upon the applied field and the permittivity of the dielectric material. Assuming one of the semiconductors layers to exhibit such unstimulable characteristics, and denoting this layer by the subscript 2, the displacement within the layer may be expressed as $$D_2=\epsilon_2 E_2 \qquad (1)$$

where:

$D_2$ is the normal component of displacement in the (unstimulable) semiconductor layer;

$\epsilon_2$ is the permittivity constant of this layer in the direction normal to the interface; and $E_2$ is the normal component of the electric field intensity in this semiconductor layer at the interface.

If the other semiconductor layer (to be denoted by the subscript 1) is of the type which exhibits a field-independent polarization component (in addition to the unstimulable field-dependent component of polarization), the dielectric displacement within this layer may be expressed in the form $$D_1=P(\xi)+\epsilon_1 E_1 \qquad (2)$$

where $D_1$ is the normal component of dielectric displacement in the field-independent semiconductor layer;

*is* is the field-independent polarization in this layer at the interface;

$\xi$is an externally applied stimulus, which may take the form of (i) stress, (ii) heat, (iii) a previously applied field, or (iv) any other stimulus which produces field-independent polarization effects;

$\epsilon_1$ is the permittivity of this semiconductor layer in a direction normal to the interface; and $E_1$ is the normal component of electric field intensity in this semiconductor layer at the interface.

The term "material exhibiting field-independent polarization" is meant to include materials which exhibit piezoelectric, pyroelectric or ferroelectric effects, or any similar effect in which the polarization of the material is variable in response to a stimulus other than the electric field present in the material.

As previously mentioned, the normal component of dielectric displacement must be continuous at the interface between the aforementioned (unstimulable and field-independent material) semiconductor layers. This condition is expressed by equating equations (1) and (2) to give $$\epsilon_2 E_2-\epsilon_1 E_1=P(\xi) \qquad (3)$$

In the particular case where the field-independent semiconductor material is piezoelectric, $$P(\xi)=e_1 S \qquad (4)$$

where $S$ is the applied stress in a direction normal to the interface, and $e_1$ is the piezoelectric constant of the field-independent semiconductor material.

Combining equations (3) and (4)

$$\epsilon_2 E_2-\epsilon_1 E_1=e_1 S \qquad (5)$$

From equation (3), it is clear that an external stimulus of the type which alters the field in dependent polarization of one of the semiconductor materials at the interface will alter the electric field conditions at the interface. Alteration of these electric field conditions involves a change in barrier height at the interface as well as a realignment of charge carriers in both semiconductor layers, i.e., a change in depletion layer width at the interface.

Equation 5 indicates that application of stress to a piezoelectric semiconductor which is in contact with a non-piezoelectric semiconductor results in a change in the electrical parameters of the composite structure, due to a realignment of charge carriers and change in barrier height in the interface between the semiconductor regions.

Equations (3) and (5) may be extrapolated to the more general case of contiguous semiconductor layers which possess different field-independent polarization characteristics. Application of a stimulus to such a structure likewise results in a change in the electric field conditions at the interface between the semiconductor regions, characterized by a change in barrier height and realignment of charge carriers at the interface. In the case where one of the semiconductor materials does not exhibit field-independent polarization, the corresponding polarization factor is zero, and equations (3) and (5) apply.

A stress-sensitive semiconductor device may be constructed by providing a heterojunction between two semiconductor layers having different piezoelectric constants (one of the piezoelectric constants may be zero); the foregoing discussion provides a basis for consideration of the operation of such a device.

While the two semiconductor layers may be of the same conductivity type, we prefer to employ layers of mutually different conductivity types, so that a PN-heterojunction is formed at the interface therebetween. Such a PN-heterojunction can be of either an injecting or high-recombination interface type. A PN-heterojunction of the injecting type, when forward biased, exhibits minority carrier injection, and a number of special transducer structures may be realized utilizing this injection mechanism. The high-recombination type of PN-heterojunction does not exhibit minority carrier injection, and is more limited in its applications.

For example, either type of PN-heterojunction may be forward biased by means of a voltage source connected in series with a resistor, so that application of stress to the junction results in modulation of current flow across the junction, manifested by a change in the voltage appearing across the resistor.

Alternatively, either type of PN-heterojunction may be reverse biased, and a similar circuit employed to monitor the variation in reverse "leakage" current across the junction. The reverse biased PN-heterojunction may be employed as a capacitive transducer, a suitable circuit being employed to monitor the variation in capacitance (due primarily to the change in depletion layer width) of the heterojunction structure in response to applied stress.

Using the injecting type of PN-heterojunction, still another stress-sensitive transducer may be constructed in the form of a heterojunction between semiconductor regions of mutually different conductivity type, at least one of these regions being piezoelectric, the particular materials and impurity concentration levels being chosen so that the heterojunction, when suitable biased, exhibits light emission.

Such a heterojunction may be formed between gallium phosphide and gallium arsenide-phosphide to provide a device which emits visible light. The application of stress to this device results in a corresponding variation in current flow across the PN-heterojunction, with consequent modulation of the light emitted therefrom.

A light-emitting heterojunction structure of the general type described above may be provided with cleaved and/or polished oppositely disposed surfaces, normal to the heterojunction plane, to form an optical cavity so that the device functions as a laser. Suitable materials for such a laser structure are gallium arsenide and gallium arsenide-phosphide, $GaAs_{1-X}P_X$, where $X<0.44$. When the PN-heterojunction of this structure is stressed, the amplitude of the coherent light emitted therefrom varies in accordance with the applied stress. In this case, the baising means must of course be such as to provide a current density at the heterojunction which is in excess of the threshold value required to produce laser action.

In order to provide a PN-heterojunction of the type described which exhibits good injection characteristics, it is desirable that the semiconductor layers be crystalline (defined for the purposes of this specification as (i) monocrystalline or (ii) macroscopically polycrystalline (relatively large individual crystallites being preferred), especially in the vicinity of the interface therebetween, with a minimum of crystal defects at the interface. In order to minimize such crystal defects, the materials which comprise the adjacent semiconductor layers should have closely matching crystal structures and crystal lattice constants.

I have found that selenium is a desirable semiconductor for the unstimulable material of one of the semiconductor layers. Selenium possesses a hexagonal crystal form which closely matches the crystal structure and lattice spacing of a number of piezoelectric semiconductor materials.

Some materials which have been found to form a highly stress-sensitive PN-heterojunction with hexagonal crystalline selenium are cadmium sulfide (CdS), arsenic sulfide (AsS), arsenic selenide ($As_2Se_3$), antimony sulfide ($Sb_2S_3$) and antimony selenide ($Sb_2Se_3$).

A stress-sensitive semiconductor device 1 employing a selenium-cadmium selenide heterojunction is shown in FIG. 1. The device 1 comprises a flexible substrate 2 which may comprise either a metallic or an insulating material. The substrate 2 may comprise a thin insulating material such as glass, mica, alumina, beryllia, acrylic plastic or polyimide. We prefer, however, to employ for the material of the substrate 2 the polyamide resin sold by E. I. duPont Company under the trade designation "KAPTON." Polyethylene terephthalate, a material sold by E. I. duPont Company under the trade designation "MYLAR," is also suitable.

One edge of the substrate 2 is secured to a fixed support 3 in cantilever fashion. The substrate 2 may be flexed by application of force in the directions indicated by the arrows at the edge of the substrate 2 which is opposite the fixed support 3.

A thin layer 4 comprising gold is disposed on and adherent to one surface of the substrate 2. The gold layer 4 may typically have a thickness on the order of 500 Angstroms.

Disposed on the gold layer 4 is a thin evaporated layer 5 comprising tellurium. The tellurium layer 5 adheres well to the gold layer 4 and has a crystal structure and lattice constant which closely matches the corresponding parameters of the overlying selenium layer 6. The tellurium layer 5 may have a thickness ranging from a few atomic diameters to approximately 1 micron.

A selenium layer 6 overlies the tellurium layer 5 and forms an active semiconductor region of the device 1. The selenium layer 6 may typically have a thickness in the range of 0.1 to 2 microns.

The tellurium layer 5 acts as a "buffer" to match the crystalline structure of the selenium layer 6 to the totally different structure of the gold electrode layer 4.

Disposed on the selenium layer 6 is a piezoelectric semiconductor layer 7 comprising cadmium selenide. The cadmium selenide layer 7 may typically have a thickness on the order of 100–10,000 Angstroms. The cadmium selenide layer 7 is crystalline with a hexagonal crystal structure substantially epitaxial with the underlying selenium layer 6.

Disposed on the cadmium selenide layer 7 is an electrode layer 8 which may comprise aluminum or any other suitable metal capable of providing ohmic contact to the layer.

The interface between the selenium layer 6 and the cadmium selenide layer 7 defines a PN-junction plane 9. Upon application of a potential difference between the electrode layers 4 and 8 by means of the corresponding terminal leads 10 and 11 to forward bias the PN-junction 9, current flows across the PN-junction 9, the current being modulated in amplitude in accordance with flexing of the substrate 2 when force is applied thereto in the direction indicated by the arrows in FIG. 1. Flexing of the substrate 2 creates stress at the PN-junction plane 9 which, as previously described, results in changes in barrier height and charge carrier distribution at the junction.

With the structure described above, the compliance and other mechanical properties of the stress-sensitive device are determined primarily by the substrate material, while the electrical properties thereof are determined by the semiconductor materials defining the stress-sensitive heterojunction. Therefore, the desired mechanical and electrical properties may be independently specified, providing a high degree of flexibility in the resultant device characteristics obtainable.

Although gold is employed as the material of the electrode electrically coupled to the selenium layer 6, other high work-function metals may be employed. Suitable metals in this category are nickel, silver and bismuth. While copper has a work function in the range described, we have found that copper diffuses through the tellurium layer 5 into the semiconductor material to deteriorate the electrical characteristics thereof. However, copper may be employed as the electrode material if the thickness of the tellurium layer 5 is made sufficiently great.

The techniques involved in providing good electrodes to selenium are described in an article by H. Schweickert, appearing in Verhandl. deut. physik, Ges. 3, 99 (1939).

The selenium layer 6 exhibits P-type conductivity, and the cadmium selenide layer 7 exhibits N-type conductivity, so that the bias source connected between the terminal leads 10 and 11 should be of such polarity as to make the terminal lead 11 more negative than the lead 10. While the source of potential difference (not shown) may comprise an alternating voltage generator (the PN-junction 9 acting to produce rectification), we prefer to employ a unidirectional source.

FIG. 2 shows the form of the applied stress versus forward bias current flow characteristic for the device of FIG. 1. It is seen that the device 1 exhibits maximum sensitivity, i.e., maximum variation of current for a given applied stress, in the region of zero stress. As the stress is increased in the positive (tension) or negative (compression) direction, the current changes substantially linearly in response to changes in stress and saturates asymmetrically with large increases in stress. Thus it is seen that no mechanical biasing is required to provide high device sensitivity.

The stress-sensitive device 1 may be fabricated by the following process:

The gold electrode layer 4 is formed by evaporating gold onto the "KAPTON" substrate 2, the substrate 2 being maintained substantially at room temperature. This gold evaporation step, as well as all subsequent evaporation steps, is carried out in a vacuum of $10^{-4}$ to $10^{-6}$ torr.

Thereafter, a thin tellurium layer 5 is evaporated onto the gold layer 4. This step is followed by evaporation of the selenium layer 6 onto the tellurium layer 5.

After evaporation the selenium layer is amorphous. At this point in the manufacturing process, the substrate is removed from the vacuum system and heated in air at 100° to 210° C. for several minutes until the red transparent amorphous selenium is crystallized. Crystallization of the selenium is evidenced by conversion thereof to a gray opaque layer.

The thin tellurium layer 5 serves to aid in crystallization of the selenium layer 6, and to permit the crystallization to occur at a lower temperature and in a shorter time than would otherwise be required. The tellurium layer 5 also serves to prevent the selenium layer 6 from cracking or peeling during and after the crystallization step.

After the selenium layer has been crystallized (to a gray hexagonal crystal form), the substrate is returned to the vacuum chamber and a thin crystalline cadmium selenide layer 7 is evaporated onto the selenium layer 6.

Finally, a thin conductive aluminum (or any other metal making ohmic contact) electrode layer 8 is evaporated on the cadmium selenide layer 7.

The resultant device 1 may be protected from environmental contamination by coating with a suitable encapsulant (not shown).

The stress transducer 1 may be utilized in various devices where information in the form of stress variations is to be converted to an electrical signal, or for the electrical measurement of strain. Such applications are described, e.g., in an article by R. M. Moore entitled "Semiconductor Gages Make Sense in Most Transducer Applications," published in *Electronics*, Mar. 18, 1968, page 109.

One application is the conversion of the information contained on a record into a corresponding electrical signal. This information is recorded in the form of undulations in the record groove. The information may correspond to audio or video signals, or both. In a stereophonic record, two sets of undulations are present, one being formed on each side face of the V-shaped record groove.

Figure 4:
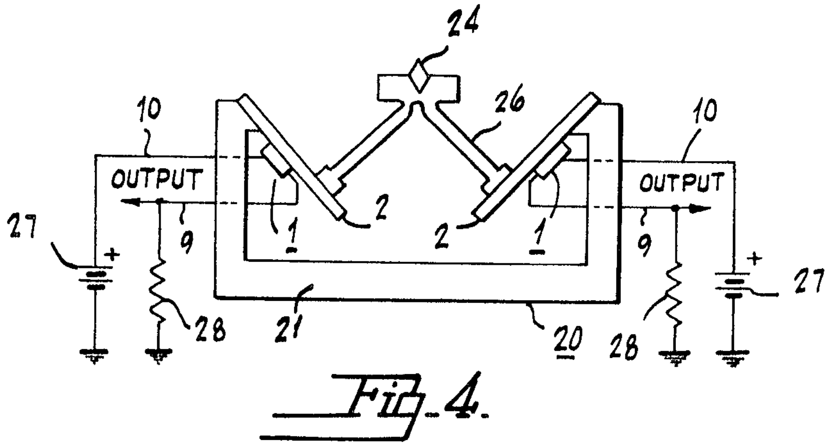

A stereophonic pickup 20 is shown in FIGS. 3, 4, and 5. The pickup 20 comprises a frame 21, and a pair of stress-sensitive devices 1 each having a substrate 2. One edge of each of the substrates 2 is secured to a rigid strip 22 on a corresponding part of the frame 21. The frame 21 and strips 22 may preferably comprise a relatively rigid plastic insulating material such as "LUCITE." Relatively rigid strips 23 are bonded to corresponding edges of each substrate 2 opposite the edges of the substrate which are secured to the "LUCITE" strips 23. A stylus 24 having a flexible support strip 25 is coupled to the strips 23 by means of a yoke 26. The yoke 26 preferably comprises an elastomeric material such as rubber, and serves to couple movements of the stylus 24 (due to the undulations of the record groove) to the substrates 2, in such a manner that each of the substrates 2 is flexed in accordance with the undulations of a corresponding side face of the V-shaped record groove.

The stylus support strip 25 is secured at one end to the stylus 24 and yoke 26, and at the other end to the frame 21.

The terminal leads 9 and 10 of each of the stress-sensitive devices 1 are electrically connected to a unidirectional voltage source 27 through a series resistor 28. As the substrates 2 are flexed in accordance with the movement of the stylus 24, the voltage appearing across each of the resistors 28 is modulated in accordance with the stylus movement. These voltage changes represent the output of the pickup, and may be applied to a suitable amplifier or other electrical circuitry to reproduce the information contained on the record.

Although certain specific semiconductors have been described as possessing piezoelectric qualities, other semiconductors comprising (i) compounds of elements selected from Groups III and V of the Periodic Table or (ii) compounds of elements selected from Groups II and VI of the Periodic Table may also be employed as piezoelectric semiconductors.

What is claimed is:

1. A transducer comprising:

a body including first and second contiguous regions of semiconductor material having mutually different field-independent polarizations, the field-independent polarization of at least one of said regions being variable in response to an external stimulus;

said regions having therebetween and interface defining a PN-heterojunction which has a particular potential barrier and a particular charge carrier distribution;

means for applying a bending stimulus which is transmitted throughout said interface, said stimulus having the effect of altering said field-independent polarization of said at least one region, and of changing said potential barrier height and said charge carrier distribution at said interface; and electrical circuit output means coupled to said body for producing a signal responsive to the variation in field-independent polarization of said at least one region.

2, A transducer according to claim 1, wherein said at least one region is pyroelectric.

3. A transducer according to claim 1, wherein said at least one region is ferroelectric.

4. A transducer according to claim 1, wherein said at least one region is piezoelectric and said stimulus comprises an applied force.

5. A transducer according to claim 1, wherein said at least one region comprises cadmium selenide, cadmium sulfide, arsenic sulfide, arsenic selenide, antimony sulfide, or antimony selenide.

6. A transducer according to claim 5, wherein the other of said regions comprises selenium.

7. A transducer according to claim 6, wherein said selenium, in the vicinity of said interface, has a hexagonal crystal structure.

8. A transducer according to claim 7, wherein said regions have closely matching crystal structures and lattice constants in the vicinity of said junction.

9. A transducer according to claim 4, further comprising a flexible substrate, said regions comprising polycrystalline layers successively deposited on the substrate, said force being applied to said interface by flexing of said substrate.

10. A transducer according to claim 9, wherein said output means includes (i) first and second electrodes electrically coupled to said first and second regions respectively, and (ii) a source of potential difference electrically coupled to said electrodes.

11. A transducer according to claim 4, wherein said interface defines a PN-junction, said source being unidirectional and polarized so as to forward bias said PN-junction.

12. A transducer according to claim 10, wherein said interface defines a PN-junction, said source being unidirectional and polarized so as to reverse bias said PN-junction.

13. A transducer according to claim 12, wherein said output means is responsive to variation in the capacitance exhibited between said electrodes.

14. A transducer according to claim 6, further comprising:

a substrate, said regions comprising overlying and underlying layers successively deposited on said substrate; and a film comprising tellurium disposed between said substrate and said underlying layer.

* * * * *